(12) United States Patent
Yeh et al.

(10) Patent No.: US 8,846,469 B2
(45) Date of Patent: Sep. 30, 2014

(54) FABRICATION METHOD OF TRENCHED POWER SEMICONDUCTOR DEVICE WITH SOURCE TRENCH

(75) Inventors: Chun Ying Yeh, Hsinchu (TW); Hsiu Wen Hsu, Hsinchu County (TW)

(73) Assignee: Great Power Semiconductor Corp., New Taipei (TW)

( * ) Notice: Subject to any disclaimer, the term of this patent is extended or adjusted under 35 U.S.C. 154(b) by 38 days.

(21) Appl. No.: 13/470,302

(22) Filed: May 12, 2012

(65) Prior Publication Data

US 2012/0322217 A1 Dec. 20, 2012

(30) Foreign Application Priority Data

Jun. 20, 2011 (TW) .............................. 100121504 A

(51) Int. Cl.
| | |
|---|---|
| H01L 21/8242 | (2006.01) |
| H01L 29/78 | (2006.01) |
| H01L 29/417 | (2006.01) |
| H01L 29/40 | (2006.01) |
| H01L 29/66 | (2006.01) |
| H01L 21/265 | (2006.01) |
| H01L 29/10 | (2006.01) |

(52) U.S. Cl.
CPC ......... *H01L 29/407* (2013.01); *H01L 29/66719* (2013.01); *H01L 29/7813* (2013.01); *H01L 29/41766* (2013.01); *H01L 29/66727* (2013.01); *H01L 29/66734* (2013.01); *H01L 21/26586* (2013.01); *H01L 29/1095* (2013.01)

USPC .......................... 438/242; 438/259; 438/270

(58) Field of Classification Search
CPC ..................... H01L 21/76897; H01L 29/7843
USPC ................... 438/237, 242, 259, 270
See application file for complete search history.

(56) References Cited

U.S. PATENT DOCUMENTS

| 7,345,342 B2 * | 3/2008 | Challa et al. ................... 257/341 |
| 7,843,004 B2 * | 11/2010 | Darwish ........................ 257/341 |
| 2008/0206944 A1 * | 8/2008 | Chuang et al. ................ 438/237 |
| 2012/0175699 A1 * | 7/2012 | Hsieh ............................ 257/332 |

FOREIGN PATENT DOCUMENTS

JP                11-26721     *    7/1997

* cited by examiner

*Primary Examiner* — Jae Lee
*Assistant Examiner* — Quovaunda V Jefferson
(74) *Attorney, Agent, or Firm* — Li & Cai Intellectual Property (USA) Office

(57) ABSTRACT

A fabrication method of a trenched power semiconductor device with source trench is provided. Firstly, at least two gate trenches are formed in a base. Then, a dielectric layer and a polysilicon structure are sequentially formed in the gate trench. Afterward, at least a source trench is formed between the neighboring gate trenches. Next, the dielectric layer and a second polysilicon structure are sequentially formed in the source trench. The second polysilicon structure is located in a lower portion of the source trench. Then, the exposed portion of the dielectric layer in the source trench is removed to expose a source region and a body region. Finally, a conductive structure is filled into the source trench to electrically connect the second polysilicon structure, the body region, and the source region.

20 Claims, 9 Drawing Sheets

FABRICATION METHOD OF TRENCHED POWER SEMICONDUCTOR DEVICE WITH SOURCE TRENCH

BACKGROUND

1. Technical Field

This invention relates to a fabrication method of a trenched power semiconductor device, and more particularly relates to a fabrication method of a trenched power semiconductor device with a source trench.

2. Description of Related Art

On-resistance (Rds(on)) is an important factor for judging the performance of a trenched power semiconductor device, and it is helpful for reducing conductive loss. However, on-resistance is restricted by the withstanding voltage (i.e., breakdown voltage) of the trenched power semiconductor device. That is, if the thickness and the resistance of the epitaxial layer are increased to improve the withstanding voltage of the trenched power semiconductor device, the increasing of conductive loss due to the increasing of on-resistance seems unpreventable.

For the above mentioned problem, as shown in FIG. 1, U.S. Pat. No. 6,710,403 has disclosed a method of forming poly-silicon-filled source trenches at the opposite sides of the gate trench for the purpose of reducing on-resistance. However, this disclosed technology needs at least three separate lithographic steps for defining the gate trench 12, the source trench 14, and the source region 16, respectively. Positioning errors between these lithographic steps may degrade the defined withstanding voltage. In addition, since a heavily doped region 18 with sufficient width should be formed adjacent to the source trench 14 for reducing contact resistance between the body and the metal layer, sufficient space should be kept between the neighboring gate trenches 12. Thus, the cell density and the on-resistance of the trenched power semiconductor device are restricted by the formation of the source trench.

SUMMARY

Accordingly, a main objective of the present invention is to provide a fabrication method of a trenched power semiconductor device with a source trench, which not only may reduce the unwanted influence due to positioning errors between different lithographic steps but also reduce the influence to the on-resistance due to the formation of the source trench.

To achieve the above-mentioned objective, the present invention provides a fabrication method of a trenched power semiconductor device with a source trench including at least the following steps: (a) providing a base; (b) forming at least two gate trenches in the base; (c) forming a first dielectric layer to line the inner surfaces of the gate trenches; (d) forming a first polysilicon structure in the gate trenches lined with the first dielectric layer; (e) forming at least a source trench between the two neighboring gate trenches; (f) forming a second dielectric layer lining the inner surfaces of the source trench; (g) forming a second polysilicon structure in a lower portion of the source trench lined with the second dielectric layer; (h) forming a body region between the neighboring gate trenches, wherein the depth of the body region is less than the depth of the source trench; (i) forming a source region in an upper portion of the body region; (j) removing a portion of the second dielectric layer to expose the source region and the body region; and (k) filling a conductive structure in the source trench for electrically connecting the second polysilicon structure, the body region, and the source region.

In order to make the aforementioned and other objectives, features and advantages of the present invention comprehensible, preferred embodiments accompanied with figures are described in detail below.

BRIEF DESCRIPTION OF THE DRAWINGS

The present invention will now be specified with reference to its preferred embodiment illustrated in the drawings, in which.

DESCRIPTION OF THE EXEMPLARY EMBODIMENTS

Figure 1:
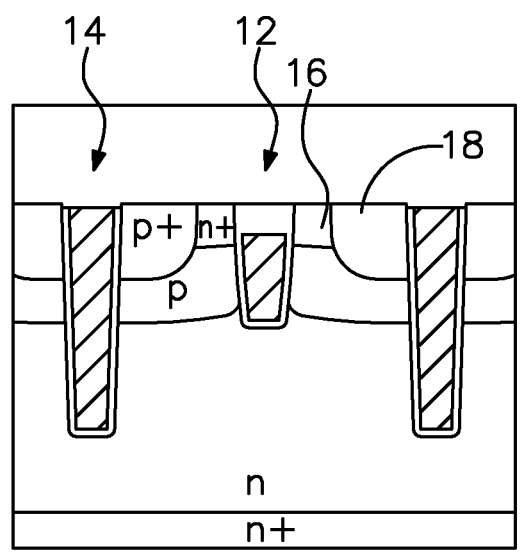
FIG. 1 is a schematic diagram of a conventional trenched power semiconductor device.
Figure 2A:
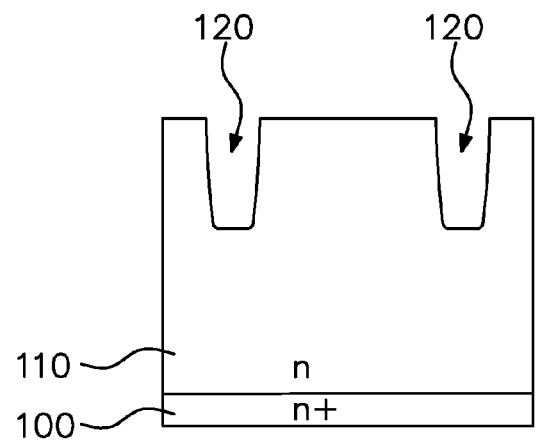
FIGS. 2A to 2H are diagrams schematically showing a fabrication method of a trenched power semiconductor device with a source trench in accordance with a first embodiment of the present invention.

FIGS. 2A to 2H are schematic diagrams showing a fabrication method of a trenched power semiconductor device with a source trench in accordance with a first embodiment of the present invention. Firstly, as shown in FIG. 2A, an N-type epitaxial layer 110 (hereinafter referred to as the epitaxial layer) is formed on an N-type substrate 100 to compose a base for forming the semiconductor device. Thereafter, a plurality of gate trenches 120 are formed in the epitaxial layer 110 by using a lithographic and etching process. Then, a first dielectric layer 130 is formed on the epitaxial layer 110 and lines the inner surfaces of the gate trenches 120. Then, a first polysilicon structure 140 is formed in the gate trench 120 as a gate structure.

Figure 2B:
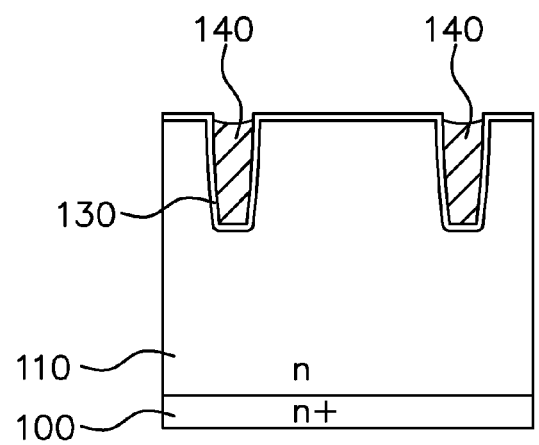
Figure 2C:
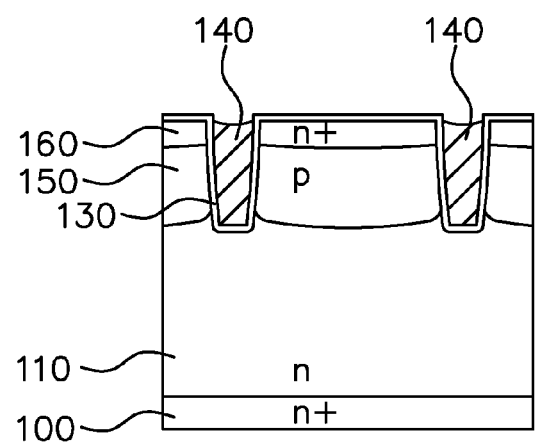

Afterward, as shown in FIG. 2C, a blanket ion implantation step is carried out to implant P-type impurities into the epitaxial layer 110 so as to form a P-type body region 150 between the neighboring gate trenches 120. Thereafter, another blanket ion implantation step is carried out to implant N-type impurities into the P-type body region 150 so as to form an N-type source doped region 160 in an upper portion of the P-type body region 150 (hereinafter referred to as the body region).

Figure 2D:
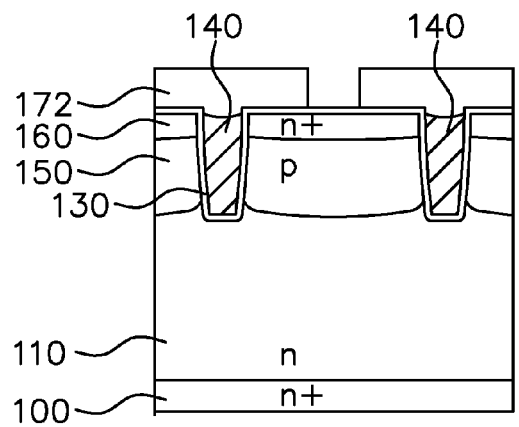
Figure 2E:
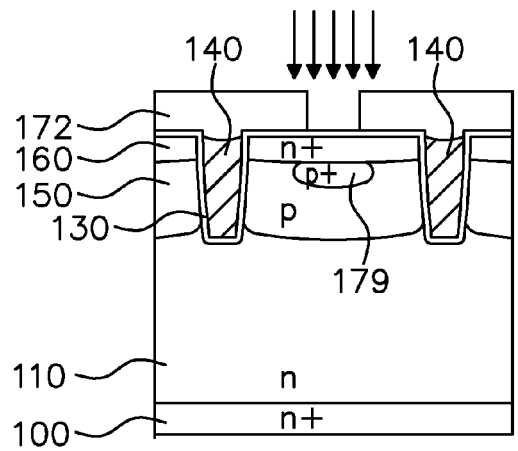

Next, as shown in FIG. 2D, an interlayer dielectric structure 172 is formed on the epitaxial layer 110 to shield the first polysilicon structure 140. The interlayer dielectric structure 172 has an opening aligned to the central position of the body region 150 between the neighboring gate trenches 120. The opening defines the location of the source trench. Thereafter, as shown in FIG. 2E, an ion implantation step is carried out to implant P-type impurities into the body region 150 by using the interlayer dielectric structure 172 as an implantation mask for forming a P-type heavily doped region 179 (hereinafter referred to as the heavily doped region) in the body region 150. The heavily doped region 179 is formed below the source doped region 160.

Figure 2F:
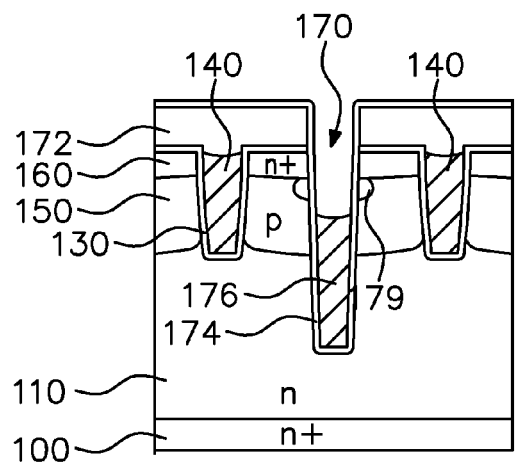

Next, as shown in FIG. 2F, an etching step is carried out with the interlayer dielectric structure 172 as an etching mask to form a source trench 170 penetrating the body region 150 in the epitaxial layer 110. After this etching step, a portion of the heavily doped region 179 still remains adjacent to the sidewall of the source trench 170. In the present embodiment, the depth of the source trench 170 extending into the epitaxial layer 110 is greater than the depth of the body region 150, and the depth of the source trench 170 is greater than the depth of the gate trench 120. Next, a second dielectric layer 174 is formed lining the exposed surfaces of the interlayer dielectric structure 172 and the source trench 170. Then, a polysilicon layer is deposited in the source trench 170 with an etching back step implemented thereafter to remove the unwanted portion of the polysilicon layer so as to leave a second polysilicon structure 176 in a lower portion of the source trench 170. It may be noted that the upper surface of the second polysilicon structure 176 is above the bottom surface of the body region 150 while below the upper surface of the source doped region 160 with a predetermined distance to facilitate the following fabrication step for forming source contact.

Figure 2G:
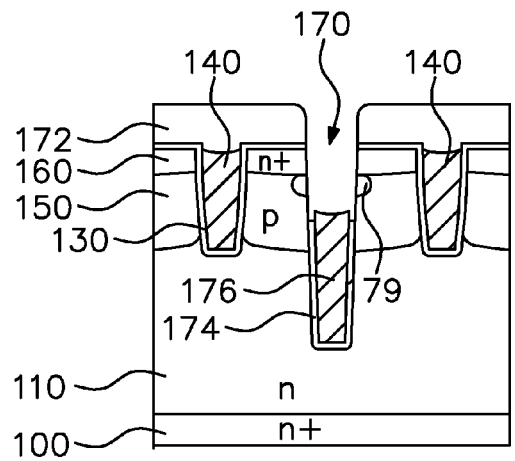
Figure 2H:
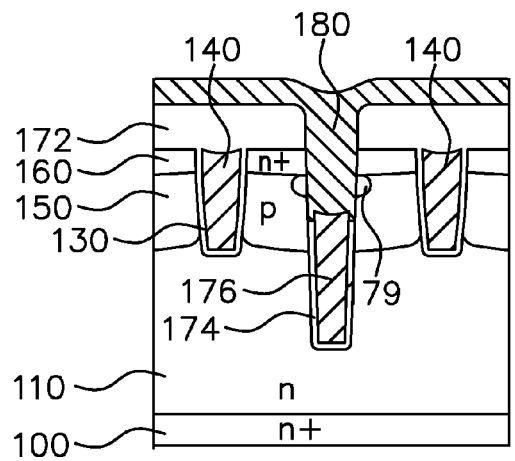

Next, as shown in FIG. 2G, an etching step is carried out to remove the exposed portion of the second dielectric layer 174 so as to expose the body region 150 and the source doped region 160. Then, as shown in FIG. 2H, a conductive structure 180, such as a source metal layer, is filled into the source trench 170 for electrically connecting the second polysilicon structure 176, the body region 150, and the source doped region 160.

The description of N-type and P-type in the above mentioned embodiment is merely for the purpose of a better understanding of the present invention, and the present invention is not so restricted. The idea of the present invention can be applied for forming the trenched power semiconductor device in a P-type substrate with no doubt.

Figure 3A:
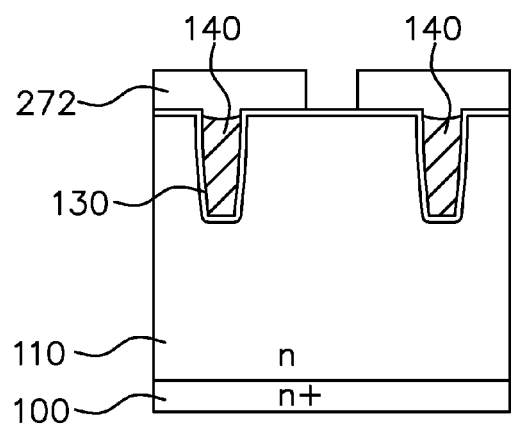
FIGS. 3A to 3D are schematic diagrams showing a fabrication method of a trenched power semiconductor device with a source trench in accordance with a second embodiment of the present invention.
Figure 3B:
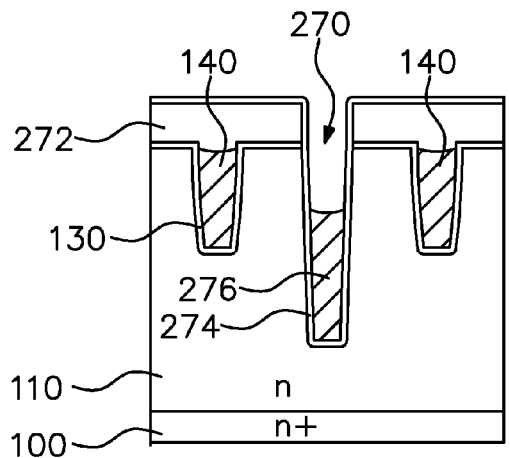

FIGS. 3A to 3D are schematic diagrams showing a fabrication method of a trenched power semiconductor device with a source trench in accordance with a second embodiment of the present invention, and the step as shown in FIG. 3A follows the step of FIG. 2B in the first embodiment. Prior to the formation of the body region 150, as shown in FIG. 3A, an interlayer dielectric structure 272 is formed on the first polysilicon structure 140 to define the location of the source trench between the neighboring gate trenches 120. The interlayer dielectric structure 272 may be a hard mask, a BPSG layer or the like. Then, as shown in FIG. 3B, an etching step is carried out to form the source trench 270 in the epitaxial layer 110 by using the interlayer dielectric structure 272 as an etching mask. In the present embodiment, the depth of the source trench 270 extending into the epitaxial layer 110 is greater than the depth of the gate trench 120.

Thereafter, a second dielectric layer 274 is formed on the epitaxial layer 110 to cover the exposed surfaces of the interlayer dielectric structure 272 and the source trench 270 and lines the inner surfaces of the source trench 270. A polysilicon layer is deposited in the source trench 270 with an etching back process implemented thereafter to remove the unwanted portion of the polysilicon layer so as to leave a second polysilicon structure 276 in a lower portion of the source trench 270. An upper surface of the second polysilicon structure 276 is below the upper surface of the epitaxial layer 110 with a predetermined distance to facilitate the following fabrication step of forming the source contact.

Figure 3C:
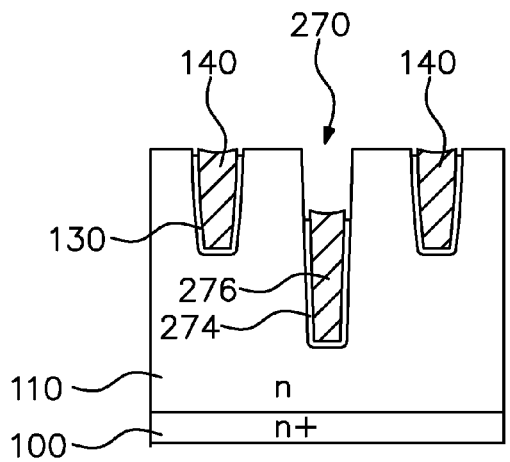
Figure 3D:
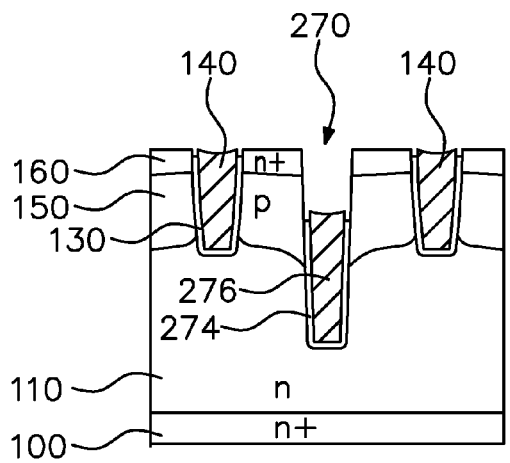

Next, as shown in FIG. 3C, an etching step is carried out to remove the exposed portion of the second dielectric layer 274 such that the upper surface of the second polysilicon structure 276 is above the upper edge of the second dielectric layer 274. The etching step at same time removes the interlayer dielectric structure 272 disposed on the first polysilicon structure 140 such that the upper surface of the epitaxial layer 110 between the source trench 270 and the gate trench 120 is exposed. Thereafter, as shown in FIG. 3D, through carrying blanket ion implantation step respectively form the body region 150 and the source doped region 160 between the source trench 270 and the gate trench 120. The body region 150 should be extended downward to the sidewall of the second dielectric layer 274. In the present embodiment, the upper surface of the second polysilicon structure 276 is above the upper edge of the second dielectric layer 274. However, the present invention is not so restricted. The upper surface of the second polysilicon structure 276 may be adjusted to a position below the upper edge of the second dielectric layer 274, if an additional etching step for widening the source contact window is carried out after the step of forming the body region 150 and the source doped region 160. The following steps of the present embodiment, such as forming the interlayer dielectric structure to shield the first polysilicon structure 140, filling the conductive structure in the source trench 270, and etc., are similar to the first embodiment and thus are not repeated here.

Figure 4A:
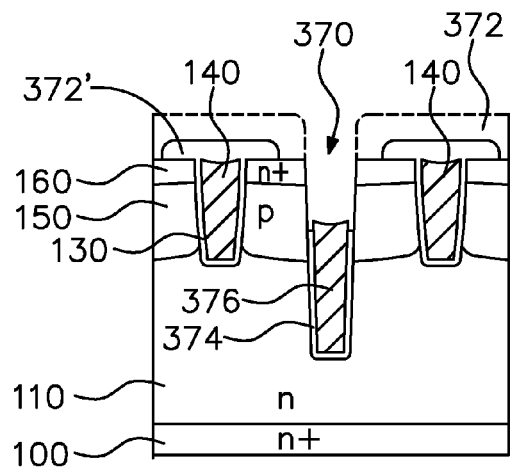
FIGS. 4A to 4D are schematic diagrams showing a fabrication method of a trenched power semiconductor device with a source trench in accordance with a third embodiment of the present invention.
Figure 4B:
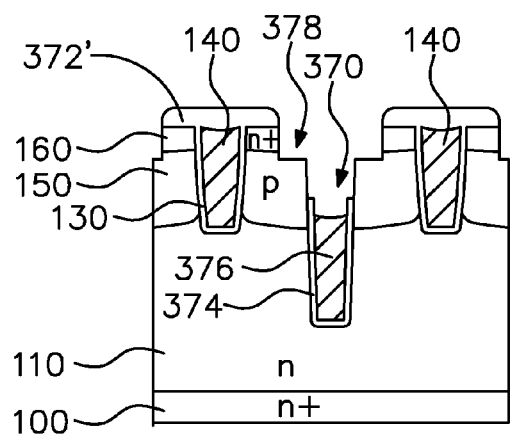
Figure 4C:
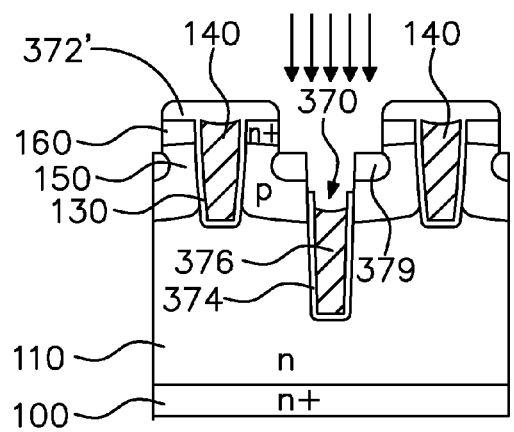

FIGS. 4A to 4C are schematic diagrams showing a fabrication method of a trenched power semiconductor device with a source trench in accordance with a third embodiment of the present invention, and the fabrication step shown in FIG. 4A follows the step of FIG. 2D in the first embodiment of the present invention. As shown in FIG. 4A, after forming the interlayer dielectric structure 372 on the first polysilicon structure 140 to define the source trench, the fabrication steps similar to the steps shown in FIGS. 2F and 2G are carried out to form a source trench 370 penetrating the body region 150 with a second dielectric layer 374 and a second polysilicon structure 376 respectively formed therein. Thereafter, the exposed second dielectric layer 374 is removed by using the isotropic etching technique. It is noted that in the present embodiment, the interlayer dielectric structure 372 is formed by using the dielectric material with identical or similar etching characteristics as the second dielectric layer 374. Thus, the exposed surfaces of the interlayer dielectric structure 372 is also etched in the present isotropic etching step such that the line width of the interlayer dielectric structure 372 is reduced and an extra portion of the body region 150 is exposed. Nevertheless, the first polysilicon structure is still the interlayer dielectric structure 372' after the etching step. However, the present invention is not so restricted. The interlayer dielectric structure 372 and the second dielectric layer 374 may be etched in two different etching steps.

Next, as shown in FIG. 4B, the body region 150 is etched with the etched interlayer dielectric structure 372' as an etching mask so as to form a contact window 378 to expose the source doped region 160. According to the above mentioned steps, it is noted that the contact window 378, which has a line width greater than the line width of the source trench 370 and is self-aligned to the source trench 370 such that a ladder-shaped structure is formed in the upper portion of the source trench 370. In addition, a portion of the second polysilicon structure 376 is also removed in the etching step so as to have the upper surface of the second polysilicon structure 376 placed below the upper edge of the second dielectric layer 374.

Thereafter, as shown in FIG. 4C, an ion implantation step is carried out to implant P-type impurities to the bottom of the contact window 378 by using the etched interlayer dielectric structure 372' as an implantation mask so as to form the P-type heavily doped regions 379 at the both sides of the source trench 370. Then, the conductive structure is filled into the contact window 378 and the source trench 370 to complete the formation of the trenched power semiconductor device.

Figure 4D:
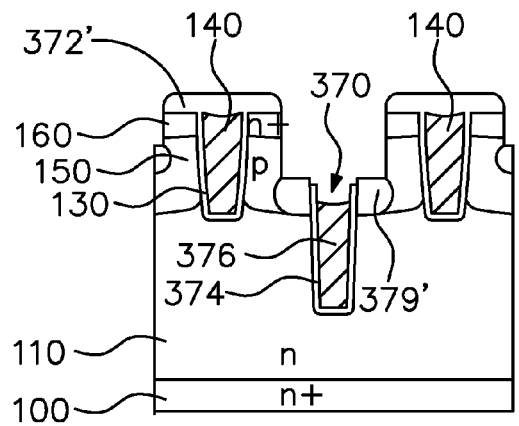

In the present embodiment, a portion of the P-type body region 150 with lower impurity concentration in contrast with the P-type heavily doped region 379 is located between the P-type heavily doped region 379 and the N-type epitaxial layer 110 therebelow. However, the present invention is not so restricted. Referring to FIG. 4D, as a preferred embodiment of the present invention, a greater implantation depth or a deeper source contact window may be applied in the present invention for forming the P-type heavily doped region 379' extending to the N-type epitaxial layer 110 below the P-type body region 150 for improving the switching speed. The attending problem of low withstanding voltage due to the heavily doped region 379' may be compensated by the formation of the second polysilicon structure 376.

Figure 5:
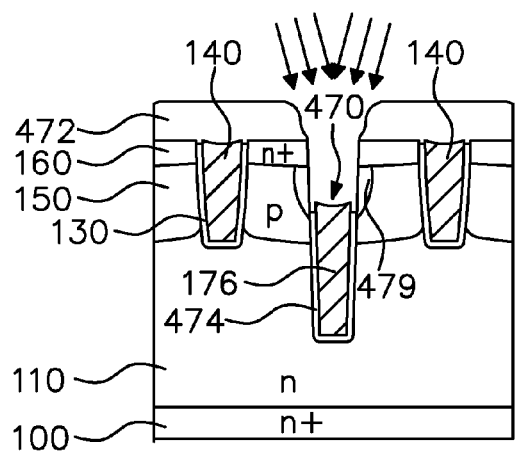
FIG. 5 is a schematic diagram showing a fabrication method of a trenched power semiconductor device with a source trench in accordance with a fourth embodiment of the present invention.

FIG. 5 is a schematic diagram showing a fabrication method of a trenched power semiconductor device with a source trench in accordance with a fourth embodiment of the present invention. In contrast with the first embodiment of the present invention, in which an ion implantation step is carried out to implant P-type impurities into the P-type body region 150 along a vertical direction as shown in FIGS. 2E and 2F so as to form the P-type heavily doped region 179 prior to the formation of the source trench 170. The present embodiment has the P-type heavily doped region 479 formed at the both sides of the source trench 470 after the formation of the source trench 470 by using a tilted ion implantation technique. As a preferred embodiment, the interlayer dielectric structure 472 may be formed by using the dielectric material with identical or similar etching characteristic with respect to the second dielectric layer 474, such that the opening of the interlayer dielectric structure 472 would be widened during the etching step of removing the exposed second dielectric layer 474 to facilitate the formation of the P-type heavily doped region 479 by the tilted ion implantation technique.

Figure 6A:
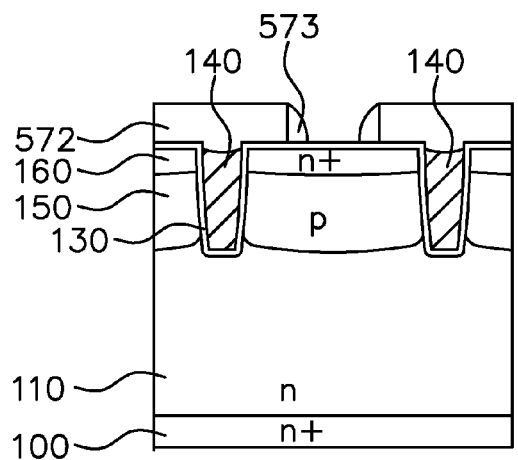
FIGS. 6A to 6C are schematic diagrams showing a fabrication method of a trenched power semiconductor device with a source trench in accordance with a fifth embodiment of the present invention.
Figure 6B:
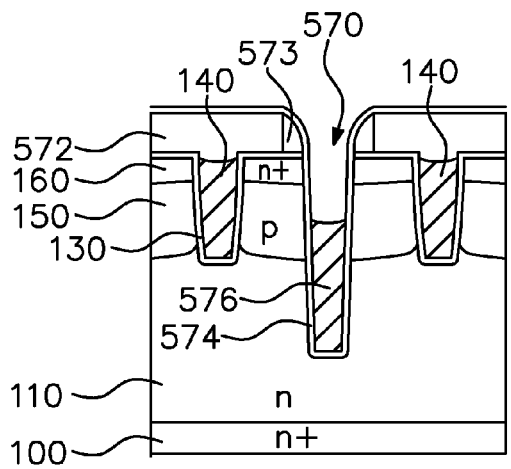
Figure 6C:
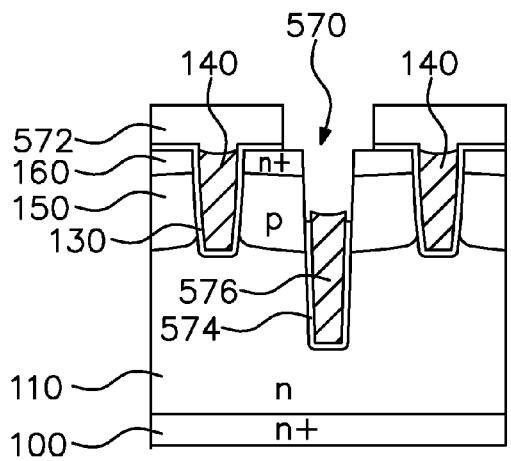

FIGS. 6A to 6C are schematic diagrams respectively showing a fabrication method of a trenched power semiconductor device with a source trench in accordance with a fifth embodiment of the present invention, and the fabrication step shown in FIG. 6A follows the fabrication step of FIG. 2D in the first embodiment of the present invention. As shown in FIG. 6A, after the formation of the interlayer dielectric structure 572, a spacer 573 is formed on the side surface of the interlayer dielectric structure 572 to reduce the size of the opening defined by the interlayer dielectric structure 572. Then, as shown in FIG. 6B, an etching step is carried out to form the source trench 570 penetrating the body region 150 below the opening defined by the spacer 573 with both the interlayer dielectric structure 572 and the spacer 573 as an etching mask. Then, a second dielectric layer 574 is formed on the exposed surfaces of the interlayer dielectric structure 572, the spacer 573, and lines the inner surfaces of the source trench 570. Then, a second polysilicon structure 576 is formed in a lower portion of the source trench 570.

Thereafter, as shown in FIG. 6C, the exposed portion of the second dielectric layer 574 is removed by etching. It is noted that the spacer 573 is also removed in the present etching step to expose the source doped region 160 below the spacer 573. In the present embodiment, the spacer 573 may be formed by using the dielectric material identical or similar to the second dielectric layer 574 such that the unwanted portion of the second dielectric layer 574 and the spacer 573 can be removed in the same etching step. However, the present invention is not so restricted. The spacer 573 and the unwanted portion of the second dielectric layer 574 may be removed in two different etching steps.

After the spacer 573 is removed, the fabrication step similar to the step shown in FIG. 4B may be adopted in the present embodiment to form the contact window in the body region 150 and have P-type impurities implanted to the bottom of the contact window; the fabrication step similar to the step shown in FIG. 2E may be adopted in the present embodiment to implant P-type impurities below the source doped region 160 by using the interlayer dielectric structure 572 as an implantation mask, or the fabrication step similar to the step shown in FIG. 5 may be adopted in the present embodiment to form the P-type heavily doped regions at the both sides of the source trench by using the tilted ion implantation technique.

Figure 7A:
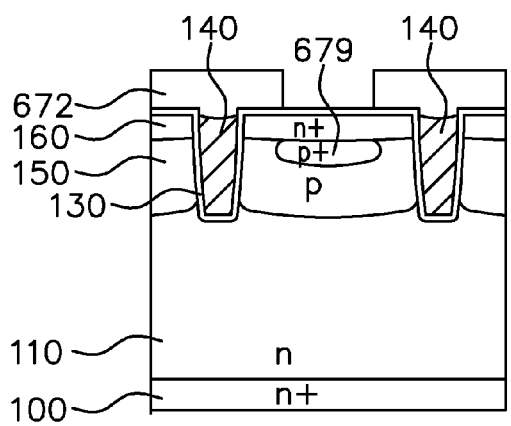
FIGS. 7A to 7C are schematic diagrams showing a fabrication method of a trenched power semiconductor device with a source trench in accordance with a sixth embodiment of the present invention.
Figure 7B:
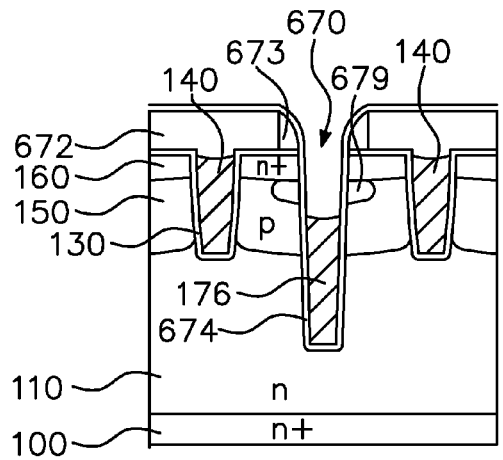
Figure 7C:
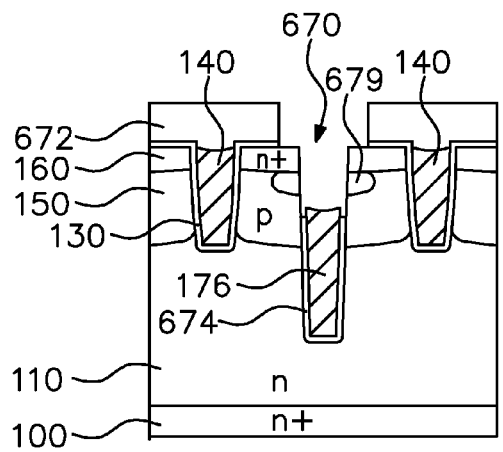

FIGS. 7A to 7C are schematic diagrams respectively showing a fabrication method of a trenched power semiconductor device with a source trench in accordance with a sixth embodiment of the present invention. In contrast with the fifth embodiment of the present invention, which has the P-type heavily doped region formed after the spacer 573 has been removed, as shown in FIG. 7A, the present embodiment has the P-type heavily doped region 679 formed in the body region 150 by using the interlayer dielectric structure 672 as an implantation mask prior to the formation of the spacer 673. Thereafter, as shown in FIG. 7B, the spacer 673 is formed on the side surface of the interlayer dielectric structure 672 to define the location of the source trench 670. Then, the epitaxial layer 110 is etched to form the source trench 670 penetrating the P-type heavily doped region 679 and the body region 150. The following steps of the present embodiment are similar to that of the fifth embodiment except the timing of forming the P-type heavily doped region 679. Since the P-type heavily doped region 679 is formed in the body region 150 prior to the formation of the source trench 670 in accordance with the present embodiment, the present embodiment does not have to apply the ion implantation step for forming the P-type heavily doped region after removing the exposed second dielectric layer 674 as shown in FIG. 7C.

Figure 8:
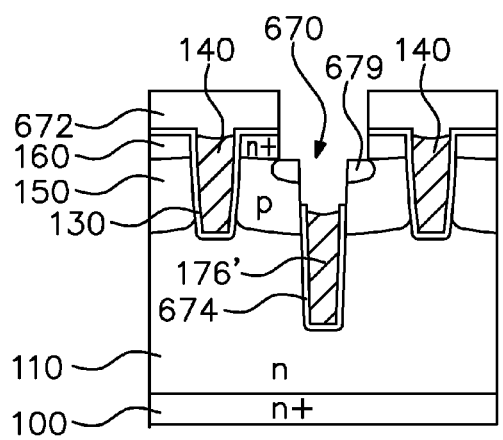
FIG. 8 is a schematic diagram showing a fabrication method of a trenched power semiconductor device with a source trench in accordance with a seventh embodiment of the present invention.

FIG. 8 is a schematic diagram showing a fabrication method of a trenched power semiconductor device with a source trench in accordance with a seventh embodiment of the present invention, and the fabrication step as shown follows the step of FIG. 7C. In contrast with the etching step of FIG. 7C, in which an etching step is carried out to remove the spacer 673 and the exposed second dielectric layer 674 but leaving the source doped region 160 unetched, in the present embodiment, an etching step processed to remove the exposed source doped region 160 after removing the spacer 673 and the exposed second dielectric layer 674 for increasing the contact area between the P-type heavily doped region 679 and the metal layer formed in the following step. It is noted that the second polysilicon structure 176' is also etched in the same etching step to have the upper surface of the second polysilicon structure 176' located below the upper edge of the second dielectric layer 674.

As mentioned above, the fabrication method of the trenched power semiconductor device in accordance with the present invention is capable to have the source trench self aligned to the P-type heavily doped region to prevent positioning errors. In addition, the junction area between the source metal layer and the heavily doped region can be enhanced by using the sidewall of the source trench for connecting the source metal layer to the source doped region and the P-type heavily doped region. Thereby, the space between neighboring gate trenches can be reduced and the on resistance of the trenched power semiconductor device can be effectively reduced.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched power semiconductor device with a source trench, comprising the steps of:
    providing a base;
    forming at least two gate trenches in the base;
    forming a first dielectric layer to line the inner surfaces of the gate trenches;
    forming a first polysilicon structure in the gate trenches lining with the first dielectric layer;
    forming an interlayer dielectric structure on the first polysilicon structure to define at least a source trench;
    forming the source trench between the two neighboring gate trenches;
    forming a second dielectric layer to line the inner surfaces of the source trench;
    forming a second polysilicon structure in a lower portion of the source trench lining with the second dielectric layer;
    forming a body region between the gate trenches, wherein the depth of the source trench is greater than the depth of the body region;
    forming a source region between the gate trenches;
    removing a portion of the second dielectric layer to expose the source region and the body region; and
    filling a conductive structure in the source trench for electrically connecting the second polysilicon structure, the body region, and the source region,
    wherein the step of forming the source trench comprises:
        forming a spacer on a side surface of the interlayer dielectric structure; and
        etching the exposed body region to form the source trench,
    wherein prior to the formation of the spacer, further comprising the step of forming a heavily doped region in the body region by using the interlayer dielectric structure as an implantation mask.

2. The fabrication method of a trenched power semiconductor device with a source trench of claim 1, wherein a depth of the source trench extending into the base is greater than the depth of the gate trench and an upper surface of the second polysilicon structure is placed above a bottom surface of the body region.

3. The fabrication method of a trenched power semiconductor device with a source trench of claim 1, further comprising the step of forming a heavily doped region in the body region.

4. The fabrication method of a trenched power semiconductor device with a source trench of claim 1, further comprising the step of forming a heavily doped region by using the interlayer dielectric structure as an implantation mask.

5. The fabrication method of a trenched power semiconductor device with a source trench of claim 4, wherein the step of forming the heavily doped region comprises:
    reducing a line width of the interlayer dielectric structure through etching to expose the body region therebelow;
    etching the body region to form a contact window by using the etched interlayer dielectric structure as an etching mask; and
    forming the heavily doped region in a bottom region below the contact window.

6. The fabrication method of a trenched power semiconductor device with a source trench of claim 5, wherein the step of reducing the line width of the interlayer dielectric structure is carried out by using isotropic etching technique.

7. The fabrication method of a trenched power semiconductor device with a source trench of claim 6, wherein the step of reducing the line width of the interlayer dielectric structure and the step of removing the portion of the second dielectric layer are carried out simultaneously.

8. The fabrication method of a trenched power semiconductor device with a source trench of claim 5, wherein a portion of the second polysilicon structure is removed in the step of etching the body region to form the contact window.

9. The fabrication method of a trenched power semiconductor device with a source trench of claim 1, wherein the step of forming the source trench is prior to the step of forming the body region.

10. The fabrication method of a trenched power semiconductor device with a source trench of claim 1, wherein the step of forming the body region is prior to the step of forming the source trench.

11. A fabrication method of a trenched power semiconductor device with a source trench, comprising the steps of:
    providing a base;
    forming at least two gate trenches in the base;
    forming a first dielectric layer to line the inner surfaces of the gate trenches;
    forming a first polysilicon structure in the gate trenches lining with the first dielectric layer;
    forming an interlayer dielectric structure on the first polysilicon structure to define at least a source trench;
    forming the source trench between the two neighboring gate trenches;
    forming a second dielectric layer to line the inner surfaces of the source trench;
    forming a second polysilicon structure in a lower portion of the source trench lining with the second dielectric layer;
    forming a body region between the gate trenches, wherein the depth of the source trench is greater than the depth of the body region;
    forming a source region between the gate trenches;
    removing a portion of the second dielectric layer to expose the source region and the body region; and
    filling a conductive structure in the source trench for electrically connecting the second polysilicon structure, the body region, and the source region,
    wherein the step of forming the source trench comprises:
        forming a spacer on a side surface of the interlayer dielectric structure; and etching the exposed body region to form the source trench wherein the spacer is removed in the step of removing the portion of the second dielectric layer to expose the source region and the body region.

12. The fabrication method of a trenched power semiconductor device with a source trench of claim 11, wherein a depth of the source trench extending into the base is greater than the depth of the gate trench and an upper surface of the second polysilicon structure is placed above a bottom surface of the body region.

13. The fabrication method of a trenched power semiconductor device with a source trench of claim 11, further comprising the step of forming a heavily doped region in the body region.

14. The fabrication method of a trenched power semiconductor device with a source trench of claim 11, further comprising the step of forming a heavily doped region by using the interlayer dielectric structure as an implantation mask.

15. The fabrication method of a trenched power semiconductor device with a source trench of claim 14, wherein the step of forming the heavily doped region comprises:

reducing a line width of the interlayer dielectric structure through etching to expose the body region therebelow;

etching the body region to form a contact window by using the etched interlayer dielectric structure as an etching mask; and forming the heavily doped region in a bottom region below the contact window.

16. The fabrication method of a trenched power semiconductor device with a source trench of claim 15, wherein the step of reducing the line width of the interlayer dielectric structure is carried out by using isotropic etching technique.

17. The fabrication method of a trenched power semiconductor device with a source trench of claim 14, wherein after the step of forming the source trench penetrating the heavily doped region, a portion of the heavily doped region is left adjacent to a sidewall of the source trench.

18. The fabrication method of a trenched power semiconductor device with a source trench of claim 11, after the step of forming the source trench, further comprising the step of forming a heavily doped region adjacent to a sidewall of the source trench by using tilted ion implanting technique.

19. The fabrication method of a trenched power semiconductor device with a source trench of claim 11, wherein the step of forming the source trench is prior to the step of forming the body region.

20. The fabrication method of a trenched power semiconductor device with a source trench of claim 11, wherein the step of forming the body region is prior to the step of forming the source trench.

* * * * *